(12) United States Patent
Liu et al.

(10) Patent No.: US 11,861,931 B2
(45) Date of Patent: Jan. 2, 2024

(54) PIEZOELECTRIC SENSOR AND MANUFACTURING METHOD THEREFOR, AND ELECTRONIC DEVICE

(71) Applicant: BOE TECHNOLOGY GROUP CO., LTD., Beijing (CN)

(72) Inventors: Yingming Liu, Beijing (CN); Haisheng Wang, Beijing (CN); Xiaoliang Ding, Beijing (CN); Lei Wang, Beijing (CN); Changfeng Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 244 days.

(21) Appl. No.: 17/414,372

(22) PCT Filed: Jun. 2, 2020

(86) PCT No.: PCT/CN2020/093883
§ 371 (c)(1),
(2) Date: Jun. 16, 2021

(87) PCT Pub. No.: WO2020/259224
PCT Pub. Date: Dec. 30, 2020

(65) Prior Publication Data
US 2022/0043996 A1    Feb. 10, 2022

(30) Foreign Application Priority Data

Jun. 25, 2019 (CN) .......................... 201910553494.9

(51) Int. Cl.
*G06K 9/00* (2022.01)
*G06V 40/13* (2022.01)
(Continued)

(52) U.S. Cl.
CPC ........ *G06V 40/1318* (2022.01); *B06B 1/0692* (2013.01); *H10K 59/65* (2023.02);
(Continued)

(58) Field of Classification Search
CPC .. G06V 40/1318; H10K 59/65; H10N 30/045; H10N 30/077; H10N 30/857; B06B 1/0692; B06B 2201/70
See application file for complete search history.

(56) References Cited

U.S. PATENT DOCUMENTS 5,515,738 A     5/1996  Tamori
2019/0065811 A1* 2/2019  Cao .................... G06V 40/1318

FOREIGN PATENT DOCUMENTS

CN       207182314 U    4/2018
CN       207557966 U    6/2018
(Continued)

*Primary Examiner* — Abdul-Samad A Adediran
(74) *Attorney, Agent, or Firm* — Chiwin Law LLC (57) ABSTRACT

A piezoelectric sensor, a manufacturing method thereof and an electronic device are provided. The piezoelectric sensor includes a substrate, an active layer, the active layer being disposed at a side of the substrate: a first electrode, the first electrode being disposed at a side of the active layer a wav from the substrate, and the first electrode including a plurality of sub-electrodes disposed at intervals: a piezoelectric layer, the piezoelectric layer being disposed at a side of the first electrode away from the active layer; and a second electrode, the second electrode being disposed at a side of the piezoelectric layer away from the first electrode. The active layer is configured to be capable of switching between an insulating state and a conducting state, and in the conducting state the active layer is capable of conducting the plurality of sub-electrodes.

20 Claims, 5 Drawing Sheets

(51) Int. Cl.
    *B06B 1/06*         (2006.01)
    *H10K 59/65*       (2023.01)
    *H10N 30/045*     (2023.01)
    *H10N 30/077*     (2023.01)
    *H10N 30/857*     (2023.01)

(52) U.S. Cl.
    CPC ......... *H10N 30/045* (2023.02); *H10N 30/077* (2023.02); *H10N 30/857* (2023.02); *B06B 2201/70* (2013.01)

(56) References Cited

FOREIGN PATENT DOCUMENTS

| | | |
|---|---|---|
| CN | 207557967 U | 6/2018 |
| CN | 110277484 A | 9/2019 |
| EP | 0649116 A1 | 4/1995 |
| KR | 20170104314 A | 9/2017 |

\* cited by examiner

PIEZOELECTRIC SENSOR AND MANUFACTURING METHOD THEREFOR, AND ELECTRONIC DEVICE

CROSS-REFERENCE TO RELATED APPLICATIONS

This application is a U.S. National Phase Entry of International Application No. PCT/CN2020/093883 filed on Jun. 2, 2020, designating the United States of America and claiming priority to Chinese Patent Application No. 201910553494.9, filed on Jun. 25, 2019. The present application claims priority to and the benefit of the above-identified applications and the above-identified applications are incorporated by reference herein in their entirety.

TECHNICAL FIELD

Embodiments of the present disclosure relate to a piezoelectric sensor and a manufacturing method thereof, and an electronic device.

BACKGROUND

The working principle of a piezoelectric sensor is to transmit an ultrasonic wave with a specific frequency by using the inverse piezoelectric effect (an alternating voltage is applied in a specific direction to vibrate a piezoelectric material) of the piezoelectric material (for example, acting as a transmitter). In a propagation process of the ultrasonic wave, energy attenuation or phase change occurs due to a contact with a to-be-detected object, and the positive piezoelectric effect occurs (electric charges are generated under the pressure effect of the ultrasonic wave) when the ultrasonic wave reaches a piezoelectric material acting as a receiver, so as to determine a change of energy or phase of the ultrasonic wave to realize sensing detection. For example, the piezoelectric sensor may be utilized to determine a physical environment in a propagation path of the ultrasonic wave, such as fingerprint recognition, touch switch, pressure sensor, imaging of human internal organs, and flaw detection of metal products.

SUMMARY

Embodiments of the present disclosure relate to a piezoelectric sensor and a manufacturing method thereof, and an electronic device, in which a piezoelectric layer has relatively good homogeneity during polarization, can improve the detection sensitivity and the accuracy of the piezoelectric sensor and improve the operation performance of the piezoelectric sensor.

At least one embodiment of the present disclosure provides a piezoelectric sensor, including: a substrate; an active layer, the active layer being disposed at a side of the substrate; a first electrode, the first electrode being disposed at a side of the active layer away from the substrate, and the first electrode including a plurality of sub-electrodes disposed at intervals; a piezoelectric layer, the piezoelectric layer being disposed at a side of the first electrode away from the active layer; and a second electrode, the second electrode being disposed at a side of the piezoelectric layer away from the first electrode. The active layer is configured to be capable of switching between an insulating state and a conducting state, and in the conducting state, the active layer is capable of conducting the plurality of sub-electrodes.

According to the embodiment of the present disclosure, a spacing region is provided between adjacent sub-electrodes in the plurality of sub-electrodes, and an orthographic projection of the active layer on the substrate at least covers an orthographic projection of the spacing region on the substrate.

According to the embodiment of the present disclosure, the piezoelectric sensor further includes: a piezoelectric sensing circuit, wherein the piezoelectric sensing circuit includes a plurality of thin film transistors, and the plurality of thin film transistors are connected to the plurality of sub-electrodes in one-to-one correspondence.

According to the embodiment of the present disclosure, a material of the active layer includes a semiconductor material.

According to the embodiment of the present disclosure, a threshold voltage of the active layer is not less than a threshold voltage of the thin film transistor.

According to the embodiment of the present disclosure, a material of the active layer includes a semiconductor material having a P-channel characteristic or a semiconductor material having an N-channel characteristic.

According to the embodiment of the present disclosure, the active layer is in contact with the plurality of sub-electrodes.

According to the embodiment of the present disclosure, the piezoelectric sensor further includes: an insulating layer, wherein the insulating layer is disposed at a side of the active layer away from the first electrode, wherein the piezoelectric sensing circuit is disposed at a side of the insulating layer away from the active layer, and the thin film transistor is connected to one of the plurality of sub-electrodes through a via hole.

According to the embodiment of the present disclosure, the piezoelectric sensor further includes: a protecting layer, wherein the protecting layer is disposed at a side of the second electrode away from the piezoelectric layer.

At least one embodiment of the present disclosure further provides a manufacturing method of a piezoelectric sensor, including: forming an active layer at a side of a substrate, the active layer being capable of switching between an insulating state and a conducting state; forming a first electrode at a side of the active layer away from the substrate, the first electrode including a plurality of sub-electrodes disposed at intervals; forming a piezoelectric layer at a side of the first electrode away from the substrate; and forming a second electrode at a side of the piezoelectric layer away from the first electrode. In the conducting state, the active layer is capable of conducting the plurality of sub-electrodes.

According to the embodiment of the present disclosure, the manufacturing method further includes: polarizing the piezoelectric layer to form the piezoelectric sensor, and when the piezoelectric layer is polarized, the active layer is capable of switching from the insulating state to the conducting state so as to conduct the plurality of sub-electrodes.

According to the embodiment of the present disclosure, a spacing region is provided between adjacent sub-electrodes in the plurality of sub-electrodes, and an orthographic projection of the active layer on the substrate at least covers an orthographic projection of the spacing region on the substrate.

According to the embodiment of the present disclosure, the manufacturing method further includes: forming a piezoelectric sensing circuit, wherein the piezoelectric sensing circuit includes a plurality of thin film transistors, and the plurality of thin film transistors are connected to the plurality of sub-electrodes in one-to-one correspondence.

According to the embodiment of the present disclosure, polarizing the piezoelectric layer includes: conducting the plurality of thin film transistors, applying a fixed voltage to the plurality of sub-electrodes respectively, and electrically connecting the second electrode to a high-voltage power supply, so that the active layer is switched from the insulating state to the conducting state to conduct the plurality of sub-electrodes; polarizing the piezoelectric layer by using a high-voltage electric field generated between the first electrode and the second electrode; and disconnecting the second electrode from the high-voltage power supply upon the piezoelectric layer having been polarized, and switching the active layer from the conducting state to the insulating state to form the piezoelectric sensor.

According to the embodiment of the present disclosure, the manufacturing method further includes: forming a piezoelectric sensing circuit at a side of the substrate, the piezoelectric sensing circuit including a plurality of thin film transistors; forming an insulating layer at a side of the piezoelectric sensing circuit away from the substrate, and forming a via hole in the insulating layer, to electrically connect the piezoelectric sensing circuit to the plurality of sub-electrodes; forming the active layer at a side of the insulating layer away from the piezoelectric sensing circuit; forming the first electrode at a side of the active layer away from the insulating layer; forming the piezoelectric layer at a side of the first electrode away from the active layer; and forming the second electrode at a side of the piezoelectric layer away from the first electrode, and forming a protecting layer at a side of the second electrode away from the piezoelectric layer.

According to the embodiment of the present disclosure, forming the piezoelectric layer includes: spin-coating a thin film of polyvinylidene fluoride on the first electrode, and forming the piezoelectric layer by using the thin film of polyvinylidene fluoride.

At least one embodiment of the present disclosure further provides an electronic device, including a fingerprint sensor, wherein the fingerprint sensor includes any of the piezoelectric sensors described above.

According to the embodiment of the present disclosure, the electronic device further includes an excitation source and a peripheral signal processor both connected to the piezoelectric sensor, wherein the excitation source controls the piezoelectric sensor to generate an ultrasonic wave, the ultrasonic wave is transmitted by the piezoelectric sensor and acts on a finger, and the piezoelectric sensor is configured to receive the ultrasonic wave reflected by the finger, convert the ultrasonic wave into a piezoelectric signal, and output the piezoelectric signal to the peripheral signal processor.

According to the embodiment of the present disclosure, the electronic device further includes a display screen, wherein the piezoelectric sensor is fixedly disposed at a side of the display screen facing away from a light-emitting side by using an optical bonding layer, and the substrate of the piezoelectric sensor is in contact with the optical bonding layer.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a manufacturing process of a piezoelectric sensor, a piezoelectric layer needs to be polarized to possess piezoelectric characteristics. In an existing piezoelectric sensor, it's easily occurred that polarization effects at different positions of the piezoelectric layer have difference therebetween. In other words, the polarization homogeneity of the piezoelectric layer is relatively poor. Subsequently, when the piezoelectric sensor works (for example, performs fingerprint recognition), problems such as relatively poor detection sensitivity and accuracy and even a failure in normal detection are easily caused. Therefore, the existing piezoelectric sensor, the manufacturing method thereof and the electronic device still need to be improved.

Figure 1:
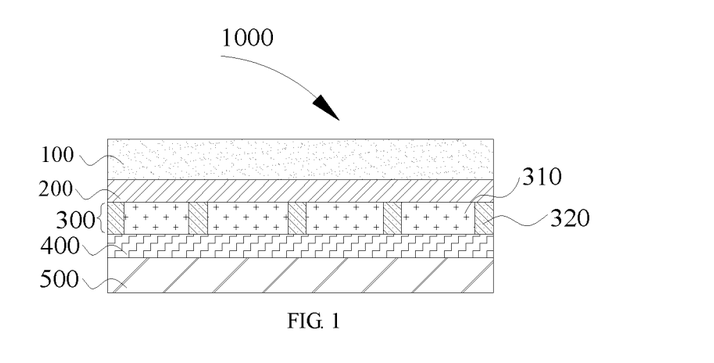
FIG. 1 is a schematic cross-sectional diagram illustrating a structure of a piezoelectric sensor provided by an embodiment of the present disclosure.

According to an embodiment of the present disclosure, referring to FIG. 1, a piezoelectric sensor 1000 includes: a substrate 100, an active layer 200, a first electrode 300, a piezoelectric layer 400, and a second electrode 500. For example, the active layer 200 is disposed at a side of the substrate 100; the first electrode 300 is disposed at a side of the active layer 200 away from the substrate 100; the first electrode 300 includes a plurality of sub-electrodes 310 disposed at intervals; the piezoelectric layer 400 is disposed at a side of the first electrode 300 away from the active layer 200, and the second electrode 500 is disposed at a side of the piezoelectric layer 400 away from the first electrode 300. For example, the active layer 200 can be switched between an insulating state and a conducting state; and in the conducting state, the active layer 200 can conduct the plurality of sub-electrodes 310. In this way, when the piezoelectric layer 400 is polarized, the active layer 200 can conduct the plurality of sub-electrodes 310, so that the consistency of the electric field applied to the piezoelectric layer 400 is better, and the polarization homogeneity of the piezoelectric layer 400 is increased, thereby improving operation performance of the piezoelectric sensor 1000.

It should be noted that, when the piezoelectric sensor 1000 works, the foregoing first electrode 300, second electrode 500 and piezoelectric layer 400 may be simultaneously used as a transmitter and a receiver. To be specific, a same piezoelectric layer 400 can be used for implementing a process of transmitting an ultrasonic signal, receiving a reflected ultrasonic signal and converting the reflected ultrasonic signal into an electric signal by using different working sequences.

For ease of understanding, the principle of the piezoelectric sensor provided in the embodiments of the present disclosure to achieve the foregoing beneficial effects will be briefly described.

Figure 2:
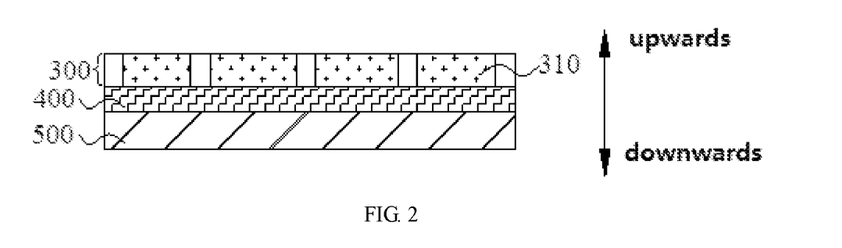
FIG. 2 is a schematic cross-sectional diagram illustrating a partial structure of a piezoelectric sensor.

As described above, the existing piezoelectric sensor has the problem that the polarization homogeneity of the piezoelectric layer is relatively poor, which affects detection sensitivity and accuracy of the piezoelectric sensor, and even causes a failure in normal use of the piezoelectric sensor. In the existing piezoelectric sensor (for example, a piezoelectric sensor bonded to a display screen and used for fingerprint recognition in an electronic device), a transmitter (Tx) and a receiver (Rx) are usually integrated together. For example, referring to FIG. 2, the piezoelectric sensor includes a first electrode 300 (the first electrode 300 includes a plurality of sub-electrodes 310 disposed at intervals, and may be used as a receiver electrode Rx) and a second electrode 500 (may be used as a transmitter electrode Tx) that are disposed opposite to each other. A piezoelectric layer 400 is provided between the first electrode 300 and the second electrode 500. When the piezoelectric sensor works, the one and same piezoelectric layer 400 can be used for transmitting an ultrasonic signal, receiving a reflected ultrasonic signal and converting the reflected ultrasonic signal into an electric signal by means of different working sequences. For example, in the manufacturing process of the piezoelectric sensor, the piezoelectric layer 400 needs to be polarized to possess piezoelectric characteristics, namely, the foregoing positive piezoelectric effect and inverse piezoelectric effect, so as to achieve the objective of sensing and detection. In an existing method for polarizing the piezoelectric layer 400, a fixed potential is usually connected to the first electrode 300 (for example, the fixed potential is connected to each sub-electrode 310 by using a piezoelectric sensing circuit (not illustrated in the figure)), and the second electrode 500 is electrically connected to a high-voltage power supply so as to form high-voltage electric fields at an upper side and a lower side of the piezoelectric layer 400. Under the effect of the high-voltage electric fields, the piezoelectric layer 400 is polarized to possess piezoelectric characteristics. In the polarization process, the fixed potential on the first electrode 300 is applied to each sub-electrode 310 by using the piezoelectric sensing circuit. In particular, for the piezoelectric sensor in which the transmitter and the receiver are integrated together, the piezoelectric sensing circuit needs to have functions including, for example, sequence control and allowing piezoelectric signals corresponding to different sub-electrodes to be transmitted according to a sequence, and the same. Therefore, the circuit usually includes a diode or a thin film transistor, to respectively control disconnection or connection of circuits at different sub-electrodes. Therefore, in the polarization process, it's easy for the fixed potentials applied to different sub-electrodes 310 by using the piezoelectric sensing circuit to have difference there-between. Consequently, the electric fields at the upper side and the lower side of the piezoelectric layer 400 corresponding to different sub-electrode 310 have difference there-between. As a result, the polarization effects at different positions of the piezoelectric layer 400 have difference there-between, and the polarization homogeneity of the piezoelectric layer 400 is relatively poor. When the piezoelectric sensor works subsequently, for example, to perform fingerprint recognition, there are problems such as relatively low detection sensitivity and accuracy, and relatively poor operation performance.

However, in the piezoelectric sensor 1000 provided in the embodiment of the present disclosure, an active layer 300 is disposed at a side of the first electrode 300 away from the piezoelectric layer 400, and the active layer 300 can be switched between an insulating state and a conducting state. When the piezoelectric layer 400 is polarized, the active layer 200 can be switched to the conducting state, so as to conduct the plurality of sub-electrodes 310, i.e., electrically connect the plurality of sub-electrodes 310, in which the plurality of sub-electrodes 310 are electrically connected into an "integral". In this way, fixed potentials applied to the plurality of sub-electrodes 310 are equal, the consistency of the electric fields on the upper side and lower side of the piezoelectric layer 400 is better, and the polarization homogeneity of the piezoelectric sensor 400 is increased, so that the detection sensitivity and accuracy of the piezoelectric sensor 1000 are improved, and the operation performance of the piezoelectric sensor 1000 is raised.

According to the embodiment of the present disclosure, the specific type of the substrate 100 is not particularly limited, for example, it may be a glass substrate or the like.

According to the embodiment of the present disclosure, a material forming the active layer 200 includes a semiconductor material, and the material forming the active layer 200 is not particularly limited. For example, it may include a semiconductor material including a P-channel characteristic or a semiconductor material including an N-channel characteristic, for example, a material doped with phosphorus element, arsenic element, boron element, gallium element or nitrogen element in semiconductor silicon. For example, the semiconductor material having the N-channel characteristic (N-type semiconductor) may be formed by doping phosphorus element, arsenic element or nitrogen element in the semiconductor silicon. For example, the semiconductor material having the P-channel characteristic (P-type semiconductor) may be formed by doping phosphorus boron element or gallium element in the semiconductor silicon. For example, the semiconductor silicon includes polysilicon but is not limited thereto.

For example, when the piezoelectric layer 400 is polarized and a high-voltage power supply connected to the second electrode 500 is a positive high-voltage power supply, the material forming the active layer 200 may be a semiconductor material having an N-channel characteristic. Therefore, during polarization, the positive high voltage electricity applied by the positive high-voltage power supply to the second electrode 500 can switch the active layer 200 from the insulating state to the conducting state, i.e., the active layer 200 is converted to a conductor so as to conduct the plurality of sub-electrodes 310 disposed at intervals. The piezoelectric layer 400 thus is polarized. After the polarization is completed, namely, when the second electrode 500 is disconnected from the positive high-voltage power supply, the active layer 200 is switched from the conducting state to the insulating state without affecting the independent work of the plurality of sub-electrodes 310. Similarly, when the piezoelectric layer 400 is polarized and the high-voltage power supply connected to the second electrode 500 is a negative high-voltage power supply, the material forming the active layer 200 may be a semiconductor material having a P-channel characteristic. Therefore, during polarization, negative high voltage electricity (for example, 5 KV negative high voltage electricity) applied by the negative high-voltage power supply to the second electrode 500 can switch the active layer 200 from the insulating state to the conducting state, i.e., the active layer 200 is converted to a conductor so as to conduct the plurality of sub-electrodes 310 disposed at intervals. The piezoelectric layer 400 thus is polarized. After the polarization is completed, namely, when the second electrode 500 is disconnected from the negative high-voltage power supply, the active layer 200 is switched from the conducting state to the insulating state without affecting the independent work of the plurality of sub-electrodes 310.

According to the embodiment of the present disclosure, as described above, when the piezoelectric layer 400 is polarized, fixed voltages are usually respectively connected to the plurality of sub-electrodes 310 through a plurality of thin film transistors; and when the piezoelectric sensor 1000 subsequently works, electric signals that are generated by a conversion of the reflected wave received by the piezoelectric layer 400 are output to the plurality of thin film transistors through the plurality of sub-electrodes 310. Therefore, a threshold voltage of the active layer 200 may be greater than a threshold voltage of the thin film transistor. Therefore, when the piezoelectric sensor 1000 works (for example, performs fingerprint recognition), it can be ensured that the active layer 200 is in the insulating state without affecting the plurality of sub-electrodes 310 in independently and respectively receiving electric signals, thereby further improving the operation performance of the piezoelectric sensor 1000. For example, the threshold voltage of the active layer 200 may be 5 kV or the like but is not limited thereto, provided that the threshold voltage of the active layer 200 allows the active layer 200 to be in the insulating state when the piezoelectric sensor 1000 works (for example, performs fingerprint recognition). A working state of the piezoelectric sensor 1000 may refer to a state of being used as an ultrasonic receiver. For example, the threshold voltage of the active layer 200 may refer to a voltage on the second electrode when the active layer 200 is in a critical conducting state, and a threshold voltage of the thin film transistor may refer to a voltage on a gate electrode when the thin film transistor is in a critical conducting state.

Figure 3A:
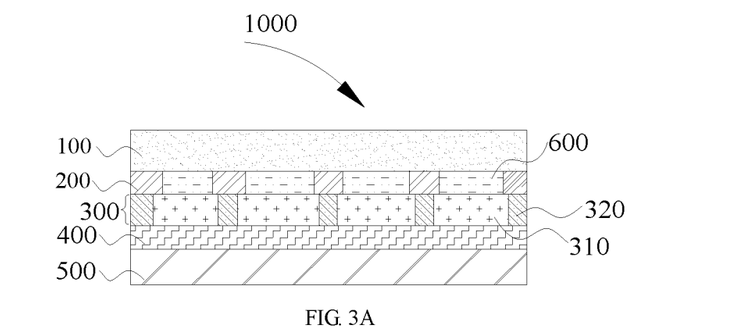
FIG. 3A is a schematic cross-sectional diagram illustrating a structure of a piezoelectric sensor provided by another embodiment of the present disclosure.

According to the embodiment of the present disclosure, the shape of the active layer 200 is not particularly limited, provided that the active layer 200 can conduct the plurality of sub-electrodes 310 when the active layer 200 is in the conducting state. For example, referring to FIG. 1 and FIG. 3a, there is a spacing region 320 among the plurality of sub-electrodes 310. An orthographic projection of the active layer 200 on the substrate 100 may at least cover an orthographic projection of the spacing region 320 on the substrate 100. For example, referring to FIG. 1, the active layer 200 may be an entire layer. Therefore, a process for preparing the active layer 200 is simple. In the conducting state, the active layer 200 can conduct the plurality of sub-electrodes 310; in the insulating state, the active layer 200 may be used as an insulating material between the substrate 100 and the first electrode 300 without affecting the operation performance of the piezoelectric sensor 1000. For example, referring to FIG. 3A, the active layer 200 may be patterned, provided that the orthographic projection of the active layer 200 on the substrate 100 covers the orthographic projection of the spacing region 320 on the substrate 100. Therefore, in the conducting state, the active layer 200 can conduct the plurality of sub-electrodes 310. For example, in the case where the active layer 200 is patterned, after the active layer 200 is formed on a side of the substrate 100, an insulating filling layer 600 may be formed in a hollow region of the active layer 200 to facilitate subsequently forming the first electrode 300 on surfaces of the active layer 200 and the insulating filling layer 600 in a better way.

Figure 3B:
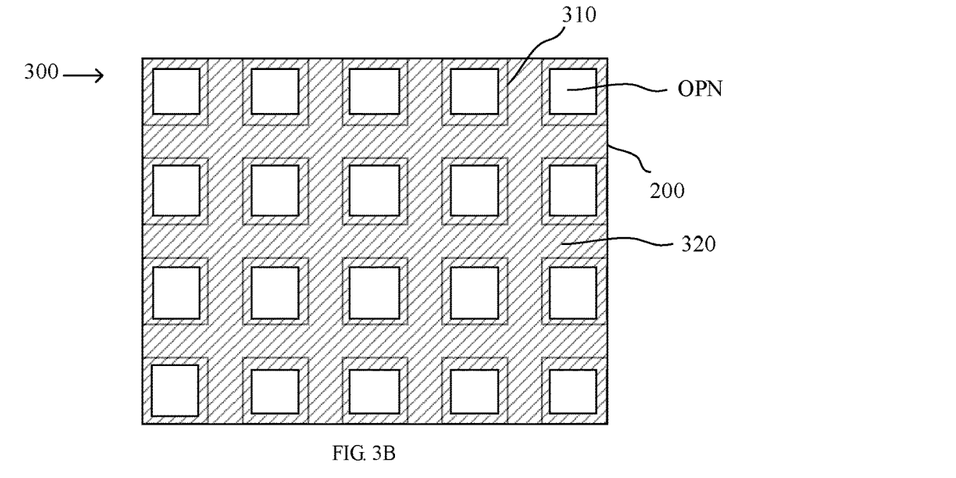
FIG. 3B is a planar diagram of a first electrode and an active layer of a piezoelectric sensor provided by an embodiment of the present disclosure.

FIG. 3B is a planar diagram of a first electrode and an active layer of a piezoelectric sensor provided by an embodiment of the present disclosure. As illustrated in FIG. 3B, adjacent sub-electrodes 310 in the plurality of sub-electrodes 310 of the first electrode 300 are spaced apart from each other. The active layer 200 is of a patterned structure, and includes a plurality of openings OPN. In a planar diagram, the plurality of openings OPN are partially overlapped with the plurality of sub-electrodes 310. To be specific, each opening OPN is partially overlapped with one sub-electrode 310. In other words, an orthographic projection of each opening OPN on the substrate is partially overlapped with an orthographic projection of one sub-electrode 310 on the substrate. The arrangement of the openings OPN can facilitate the connection between the sub-electrodes and the thin film transistors described later.

Figure 3C:
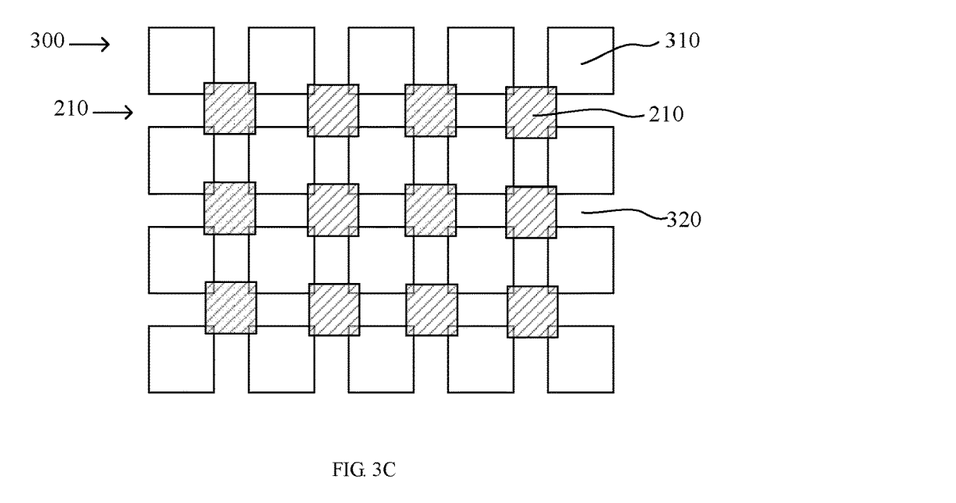
FIG. 3C is a planar diagram of a first electrode and an active layer of a piezoelectric sensor provided by an embodiment of the present disclosure.

FIG. 3C is a planar diagram of a first electrode and an active layer of a piezoelectric sensor provided by an embodiment of the present disclosure. As illustrated in FIG. 3C, the active layer 200 is a patterned structure, and includes a plurality of active sub-layers 210. The plurality of active sub-layers 210 are spaced apart from each other. In a planar diagram, each active sub-layer 210 is partially overlapped with a sub-electrode 310 adjacent thereto. In other words, an orthographic projection of each active sub-layer 210 on the substrate is partially overlapped with an orthographic projection of a sub-electrode 310 adjacent to the active sub-layer 210 on the substrate. The plurality of active sub-layers 210 are spaced apart from each other, to facilitate the connection between the sub-electrodes and the thin film transistors described later. FIG. 3C provides explanations with reference to the case in which each active sub-layer 210 is partially overlapped with four sub-electrodes 310 adjacent to the active sub-layer 210, but is not limited thereto. When the sub-electrodes 310 are arranged in other manners, the amount of the sub-electrodes 310 adjacent to each active sub-layer 210 may be another value. To be specific, in the embodiment of the present disclosure, the amount of the sub-electrodes 310 adjacent to each active sub-layer 210 may be determined according to demands.

FIG. 3B and FIG. 3C further illustrate a spacing region 320. The spacing region 320 is located between adjacent sub-electrodes 310.

According to the embodiment of the present disclosure, the first electrode 300 includes a plurality of sub-electrodes 310, and there is a spacing region 320 between adjacent sub-electrodes 310. For example, a material forming the plurality of sub-electrodes 310 may include indium tin oxide (ITO); and an insulating material such as silicon oxide ($SiO_2$), silicon nitride (SiNx), polyimide (PI) and epoxy resin may be filled in the spacing region 320. Therefore, the plurality of sub-electrodes 310 may be used as independent receiver electrodes, and can output electric signals that are generated by a conversion of the reflected wave received by the piezoelectric layer 400 to the piezoelectric sensing circuit respectively, or the like.

Figure 4A:
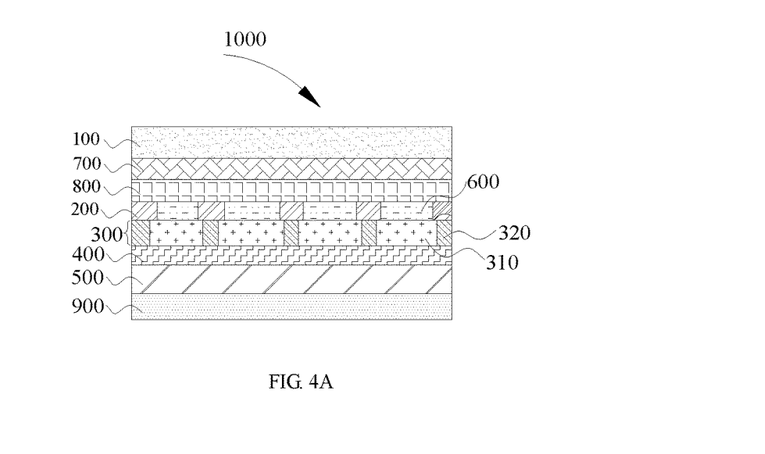
FIG. 4A is a schematic cross-sectional diagram illustrating a structure of a piezoelectric sensor provided by another embodiment of the present disclosure.

According to the embodiment of the present disclosure, referring to FIG. 4A, the piezoelectric sensor 1000 further includes a piezoelectric sensing circuit 700. The piezoelectric sensing circuit 700 may include a plurality of thin film transistors (not illustrated in the figure), and the plurality of thin film transistors are connected to the plurality of sub-electrodes 310 in one-to-one correspondence. Therefore, when the piezoelectric layer 400 is polarized, fixed potentials may be respectively applied to the plurality of sub-electrodes 310 by the plurality of thin film transistors. Furthermore, because the active layer 200 is in the conducting state during polarization, the plurality of sub-electrodes 310 may be electrically connected, so that the fixed potentials on the plurality of sub-electrodes 310 are equal, thereby improving the polarization homogeneity of the piezoelectric layer 400 and further raising the operation performance of the piezoelectric sensor 1000. In addition, when the piezoelectric sensor 1000 subsequently works (for example, performs fingerprint recognition), electric signals that are generated by a conversion of the reflected wave received by the piezoelectric layer 400 may be output to the thin film transistor, the detection circuit and the like through the plurality of sub-electrodes 310 and the connection terminals. For example, in some embodiments, to avoid mutual impact, one of a semiconductor layer and an active layer of a thin film transistor is made of a semiconductor material having a P-channel characteristic, and the other one of the semiconductor layer and the active layer of the thin film transistor is made of a semiconductor material having an N-channel characteristic.

According to the embodiment of the present disclosure, the second electrode 500 may be a whole-layered electrode, and a material forming the second electrode 500 is not particularly limited. For example, it may include silver. The second electrode 500 may be used as a transmitter electrode, so that the piezoelectric layer 400 generates and transmits ultrasonic waves under an alternating voltage.

According to the embodiment of the present disclosure, the piezoelectric layer 400 may be formed by a piezoelectric material, and the piezoelectric material may be an inorganic piezoelectric material, an organic power generation material, or the like. For example, the material forming the piezoelectric layer 400 may include polyvinylidene fluoride (PVDF), lead zirconate-titanate piezoelectric ceramics (PZT), AlN, ZnO, or the like.

According to the embodiment of the present disclosure, referring to FIG. 4A, the piezoelectric sensor 1000 may further include an insulating layer 800. The insulating layer 800 may be provided at a side of the active layer 200 away from the first electrode 300, and the piezoelectric sensing circuit 700 may be provided at a side of the insulating layer 800 away from the active layer 200. To be specific, the piezoelectric sensing circuit 700 may be firstly formed at a side of the substrate 100, and then the insulating layer 800 is formed at a side of the piezoelectric sensing circuit 700 away from the substrate 100, and then the active layer 200 is formed at a side of the insulating layer 800 away from the piezoelectric sensing circuit 700.

For example, the piezoelectric sensing circuit 700 may include a control and transmitting circuit, a detection circuit, the foregoing thin film transistor (TFT) and the like. For example, when the piezoelectric sensor 1000 works, an alternating voltage applied between the first electrode 300 and the second electrode 500 may be controlled by using the control and transmitting circuit, so as to control a phase, a strength and the like of an ultrasonic signal transmitted by the piezoelectric layer 400. For example, the detection circuit may sequentially output the electric signals that are generated by a conversion of the reflected wave received by the piezoelectric layer 400 to a peripheral signal processor according to a sequence. For example, as described above, fixed voltages may be respectively applied to the plurality of sub-electrodes 310 by the thin film transistor, so as to facilitate polarizing the piezoelectric layer 400. Furthermore, when the piezoelectric sensor 1000 subsequently works (for example, performs fingerprint recognition), the electric signals that are generated by a conversion of the reflected wave received by the piezoelectric layer 400 may be output to the thin film transistor, the detection circuit and the like by the plurality of sub-electrodes 310.

For example, the insulating layer 800 is formed between the piezoelectric sensing circuit 700 and the active layer 200. The type of the insulating layer 700 is not particularly limited, provided that the insulating layer 800 has good insulating property. For example, the insulating layer 800 may be formed by silicon nitride (SiNx). For example, in order to electrically connect the foregoing piezoelectric sensing circuit 700, first electrode 300 and second electrode 500, a structure such as a via hole may be provided in the insulating layer 800. For example, the foregoing thin film transistor may be electrically connected to the sub-electrode 310 through the via hole. Furthermore, as described above, when the active layer 200 is of a whole-layered structure, the via hole can run through the insulating layer and the active layer so as to electrically connect the piezoelectric sensing circuit 700, the first electrode 300 and the second electrode 500. For example, the piezoelectric sensing circuit 700 is insulated from the active layer 200.

According to the embodiment of the present disclosure, referring to FIG. 4A, the piezoelectric sensor 1000 may further include a protecting layer 900 provided at a side of the second electrode 500 away from the piezoelectric layer 400. Therefore, the protecting layer 900 may protect the second electrode 500 and the piezoelectric sensor 1000, so as to further improve the operation performance of the piezoelectric sensor. For example, the protecting layer 900 may be formed of an insulating material, such as epoxy resin.

Based on the above, in the piezoelectric sensor 1000 provided by the embodiment of the present disclosure, with the arrangement of the active layer 200, when the piezoelectric layer 400 is polarized, the active layer 200 can conduct the plurality of sub-electrodes 310, so that the electric fields applied to the piezoelectric layer 400 possess good consistency and the piezoelectric layer 400 has good polarization homogeneity, thereby improving the operation performance of the piezoelectric sensor 1000.

Figure 4B:
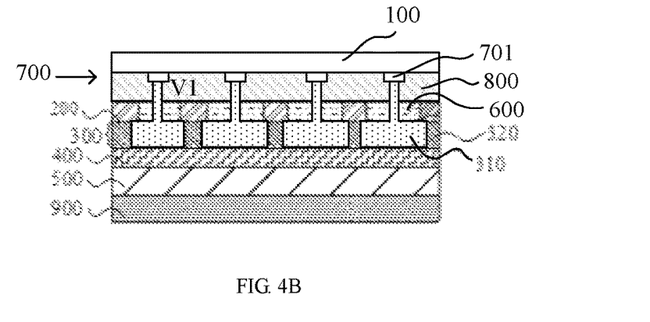
FIG. 4B is a schematic cross-sectional diagram illustrating a structure of a piezoelectric sensor provided by another embodiment of the present disclosure.

FIG. 4B is a schematic cross-sectional diagram illustrating a structure of a piezoelectric sensor provided by another embodiment of the present disclosure. As illustrated in FIG. 4B, the piezoelectric sensing circuit 700 includes a plurality of thin film transistors 701. The plurality of thin film transistors 701 are spaced apart from each other to be respectively connected to corresponding sub-electrodes 310, so as to output signals respectively.

As illustrated in FIG. 4B, the sub-electrode 310 is connected to the thin film transistor 701 through a via hole V1 running through the insulating filling layer 600 and the insulating layer 800.

Figure 4C:
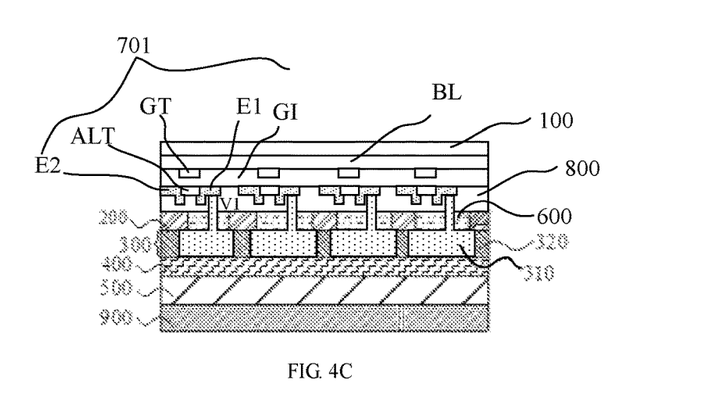
FIG. 4C is a schematic cross-sectional diagram illustrating a structure of a piezoelectric sensor provided by another embodiment of the present disclosure.

FIG. 4C is a schematic cross-sectional diagram illustrating a structure of a piezoelectric sensor provided by another embodiment of the present disclosure. As illustrated in FIG. 4C, the thin film transistor 701 includes an active layer ALT, a gate electrode GT, a gate insulating layer GI, a drain electrode E1, and a source electrode E2. The drain electrode E1 and the source electrode E2 are spaced apart from each other. The drain electrode E1 and the source electrode E2 are connected to the active layer ALT respectively. A buffer layer BL is disposed between the gate electrode GT and the substrate. The gate insulating layer GI is provided between the gate electrode GT and a layer on which the drain electrode E1 and the source electrode E2 are located. The insulating layer 800 is provided between the active layer 200 and the layer on which the drain electrode E1 and the source electrode E2 are located. The buffer layer BL, the gate insulating layer GI and the insulating layer 800 may be prepared by using an insulating material, for example, an inorganic insulating material or an organic insulating material. For example, the inorganic insulating material includes at least one of silicon oxide, silicon nitride, and silicon oxynitride, but is not limited thereto. The organic insulating material includes at least one of polyimide (PI) and epoxy resin, but is not limited thereto.

As illustrated in FIG. 4C, the sub-electrode 310 is connected to the drain electrode E1 of the thin film transistor 701 through a via hole V1 running through the insulating filling layer 600 and the insulating layer 800. In the embodiment of the present disclosure, comparatively speaking, the drain electrode E1 and the source electrode E2 can be replaced with each other. In other words, the sub-electrode 310 is connected to the drain electrode E1 or the source electrode E2 of the thin film transistor 701 through the via hole V1 running through the insulating filling layer 600 and the insulating layer 800.

As illustrated in FIG. 4C, in order to avoid mutual interference, the active layer ALT and the active layer 200 are respectively provided at two sides of the layer on which the source electrode E1 and the drain electrode E2 are located.

As illustrated in FIG. 1, FIG. 3A, and FIG. 4A to FIG. 4C, in order to facilitate electrical connection, the active layer 200 is in contact with the plurality of sub-electrodes 310. As illustrated in FIG. 3A and FIG. 4A to FIG. 4C, adjacent sub-electrodes 310 are both in contact with the active layer 200.

According to another aspect of the present disclosure, the embodiment of the present disclosure provides a manufacturing method of the foregoing piezoelectric sensor. Therefore, the piezoelectric sensor manufactured by using this method has all features and advantages of the foregoing piezoelectric sensor, and details are not described herein again. According to the embodiment of the present disclosure, referring to FIG. 5, the manufacturing method includes the following steps.

Figure 5:
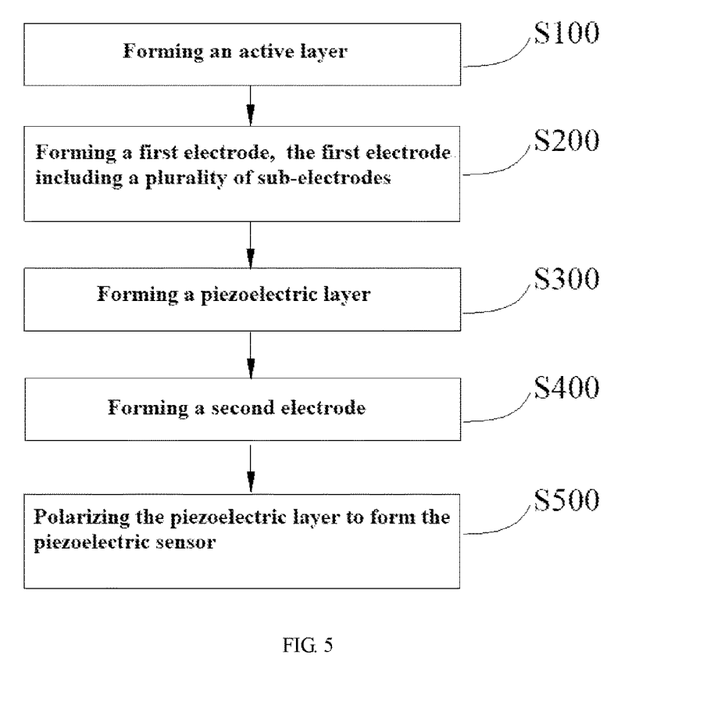
FIG. 5 is a flowchart of a manufacturing method of a piezoelectric sensor provided by an embodiment of the present disclosure.

S100: Forming an active layer.

In this step, the active layer is formed at a side of a substrate. According to the embodiment of the present disclosure, as described above, the substrate may be a glass substrate. A material forming the active layer may be a semiconductor material having a P-channel characteristic or a semiconductor material having an N-channel characteristic. For example, the active layer can be switched between an insulating state and a conducting state. According to the embodiment of the present disclosure, as described above, the active layer may be of a whole-layered structure, or a patterned hollow structure. In the case where the active layer is of the patterned hollow structure, after the active layer is formed, the manufacturing method further includes: filling an insulating material in the hollow region.

S200: Forming a first electrode, where the first electrode includes a plurality of sub-electrodes.

In this step, the first electrode is formed at a side of the active layer away from the substrate. According to the embodiment of the present disclosure, the first electrode includes a plurality of sub-electrodes, and there is a spacing region among the plurality of sub-electrodes. For example, as described above, a material forming the first electrode may include indium tin oxide (ITO) or the like; and an insulating material such as silicon oxide ($SiO_2$), silicon nitride ($SiN_x$), polyimide (PI) or epoxy resin may be filled in the spacing region. For example, when the plurality of sub-electrodes are formed, an orthographic projection of the spacing region between the plurality of sub-electrodes on the substrate is smaller than an orthographic projection of the active layer formed in the foregoing step on the substrate. In other words, the orthographic projection of the patterned active layer formed in the foregoing step on the substrate at least covers the orthographic projection of the spacing region on the substrate. Therefore, in the conducting state, the active layer can conduct the plurality of sub-electrodes.

S300: Forming a piezoelectric layer.

In this step, the piezoelectric layer is formed at a side of the first electrode formed in the foregoing step away from the active layer. According to the embodiment of the present disclosure, the material forming the piezoelectric layer may include polyvinylidene fluoride (PVDF), PZT, AlN, ZnO, or the like. For example, in this step, a thin film of polyvinylidene fluoride may be spin-coated on a side of the first electrode formed in the foregoing step away from the active layer, and the piezoelectric layer is formed by using the thin film of polyvinylidene fluoride.

S400: Forming a second electrode.

In this step, the second electrode is formed at a side of the piezoelectric layer formed in the foregoing step away from the first electrode. According to the embodiment of the present disclosure, as described above, the second electrode may be a whole-layered electrode, and a material forming the second electrode is not particularly limited, for example, it may include silver.

Figure 6:
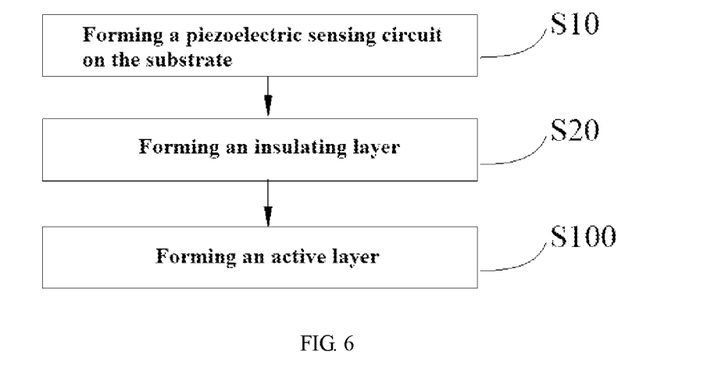
FIG. 6 is a flowchart of a manufacturing method of a piezoelectric sensor provided by another embodiment of the present disclosure.

According to the embodiment of the present disclosure, referring to FIG. 6, in order to further improve the operation performance of the piezoelectric sensor, before the active layer is formed on the substrate, the manufacturing method further includes:

S10: Forming a piezoelectric sensing circuit on the substrate.

In this step, the piezoelectric sensing circuit is formed at a side of the substrate. According to the embodiment of the present disclosure, as described above, the piezoelectric sensing circuit may include a control and transmitting circuit, a detection circuit, a thin film transistor (TFT) and the like. Fixed voltages may be respectively applied to the plurality of sub-electrodes through the thin film transistor, so as to facilitate polarizing the piezoelectric layer. Furthermore, when the piezoelectric sensor subsequently works (for example, performs fingerprint recognition), electric signals that are generated by a conversion of a reflected wave received by the piezoelectric layer may be output to the thin film transistor, the detection circuit and the like through the plurality of sub-electrodes.

S20: Forming an insulating layer.

In this step, the insulating layer is formed at a side of the piezoelectric sensing circuit formed in the foregoing step away from the substrate. According to the embodiment of the present disclosure, the material forming the insulating layer may include silicon nitride, and the like. For example, the active layer in the foregoing step may be formed at a side of the insulating layer away from the piezoelectric sensing circuit. For example, after the insulating layer is formed, a via hole may be further formed in the insulating layer to electrically connect the foregoing piezoelectric sensing circuit to the sub-electrode. For example, when the active layer prepared in the foregoing step is of a whole-layered structure, the via hole can run through the insulating layer and the active layer, so as to electrically connect the piezoelectric sensing circuit to the first electrode.

Figure 7:
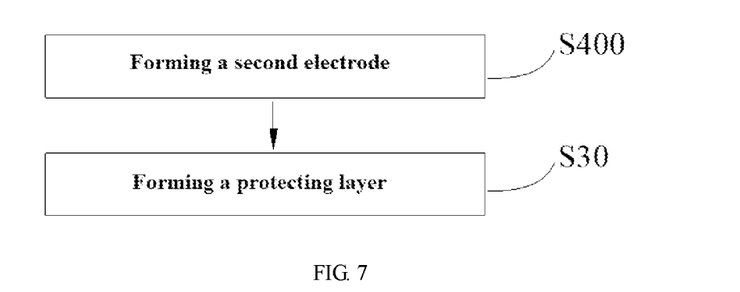
FIG. 7 is a flowchart of a manufacturing method of a piezoelectric sensor provided by another embodiment of the present disclosure.

According to the embodiment of the present disclosure, referring to FIG. 7, in order to further improve the operation performance of the piezoelectric sensor, after the second electrode is formed in the foregoing step, the manufacturing method further includes the following steps.

S30: Forming a protecting layer.

In this step, the protecting layer is formed at a side of the second electrode formed in the foregoing step away from the piezoelectric layer. According to the embodiment of the present disclosure, as described above, the protecting layer may be formed of an insulating material, such as epoxy resin.

S500: Polarizing the piezoelectric layer, to form the piezoelectric sensor.

In this step, the piezoelectric layer is polarized to possess piezoelectric characteristics so as to form the piezoelectric sensor. According to the embodiment of the present disclosure, when the piezoelectric layer is polarized, the foregoing active layer can be switched from the insulating state to the conducting state, and conduct the plurality of sub-electrodes.

According to the embodiment of the present disclosure, as described above, the piezoelectric sensing circuit may include a plurality of thin film transistors, and the plurality of thin film transistors are connected to the plurality of sub-electrodes in one-to-one correspondence. According to the embodiment of the present disclosure, polarizing the piezoelectric layer may further include: firstly, applying fixed voltages to the plurality of sub-electrodes respectively through a plurality of thin film transistors, and electrically connecting the second electrode to a high-voltage power supply, then switching the active layer from the insulating state to the conducting state under a high voltage to conduct the plurality of sub-electrodes conduct, so that the fixed voltages applied to the plurality of sub-electrodes are equal and the voltage consistency is relatively good; then polarizing the piezoelectric layer by using a high-voltage electric field generated between the first electrode and the second electrode, to allow the piezoelectric layer to possess piezoelectric characteristics; and after polarization is completed, disconnecting the second electrode from the high-voltage power supply, and switching the active layer from the conducting state to the insulating state to form the piezoelectric sensor. Therefore, this method improves the consistency of the fixed voltages applied to the first electrode, so as to improve the homogeneity of high-voltage electric fields applied to two sides of the piezoelectric layer, and improve the homogeneity of polarization effects of the piezoelectric layer, thereby further improving the operation performance of the prepared piezoelectric sensor.

Based on the above, it can be seen that, in this method, when the piezoelectric layer is polarized, the active layer can be switched to the conducting state and conduct the plurality of sub-electrodes, so that the consistency of electric fields applied to the piezoelectric layer and the polarization homogeneity of the piezoelectric layer are relatively good, thereby improving the operation performance of the prepared piezoelectric sensor.

According to another aspect of the present disclosure, an embodiment of the present disclosure provides an electronic device. According to the embodiment of the present disclosure, the electronic device includes a fingerprint sensor. The fingerprint sensor includes the foregoing piezoelectric sensor, and an excitation source and a peripheral signal processor connected to the piezoelectric sensor. For example, the excitation source can control the piezoelectric sensor to generate ultrasonic waves; the ultrasonic waves can be transmitted by the piezoelectric sensor and acted on a finger; the piezoelectric sensor receives ultrasonic waves reflected by the finger and convert the ultrasonic waves into a piezoelectric signal, and outputs the piezoelectric signal to the peripheral signal processor. Therefore, the electronic device has all features and advantages of the foregoing piezoelectric sensor, and details are not described herein again. In general, the electronic device can have relatively high accuracy and sensitivity during fingerprint monitoring, and has good operation performance. The peripheral signal processor may process a received piezoelectric signal, to further perform sensing detection such as fingerprint recognition.

Figure 8:
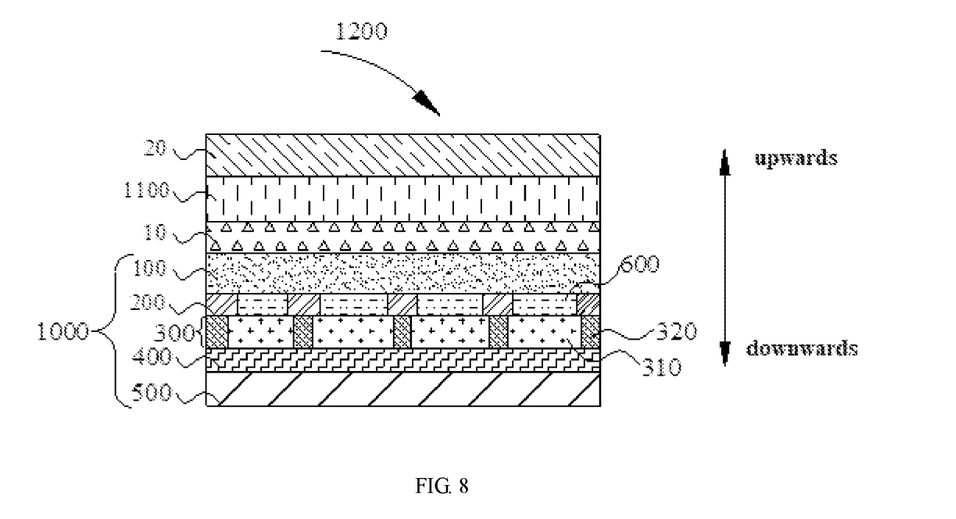
FIG. 8 is a schematic structural diagram of an electronic device provided by an embodiment of the present disclosure.

According to the embodiment of the present disclosure, referring to FIG. 8, the electronic device 1200 may include the foregoing piezoelectric sensor 1000 and a display screen 1100, and the piezoelectric sensor 1000 is fixedly disposed at a side of the display screen 1100 away from a light-emitting side by using an optical bonding layer 10. For example, the display screen 1100 may be an organic light-emitting diode (OLED) display screen. Due to a relatively small thickness, the OLED display screen can reduce energy loss and signal interference of ultrasonic transmission.

Therefore, the sensitivity of fingerprint recognition using the foregoing piezoelectric sensor is relatively high. For example, the size of the piezoelectric sensor 1000 may be the same as that of the display screen 1100. Therefore, the fingerprint recognition function of the full screen can be realized, and the operation performance of the electronic device 1200 can be further improved.

According to the embodiment of the present disclosure, referring to FIG. 8, the electronic device may further include a cover plate 20. For example, the cover plate 20 may be a glass cover plate arranged above the display screen 1100, and the cover plate 20 and the display screen 1100 may also be bonded by using an optical bonding layer (not illustrated in the figure). Therefore, the sensitivity of fingerprint recognition using the foregoing piezoelectric sensor can be further improved.

Figure 9:
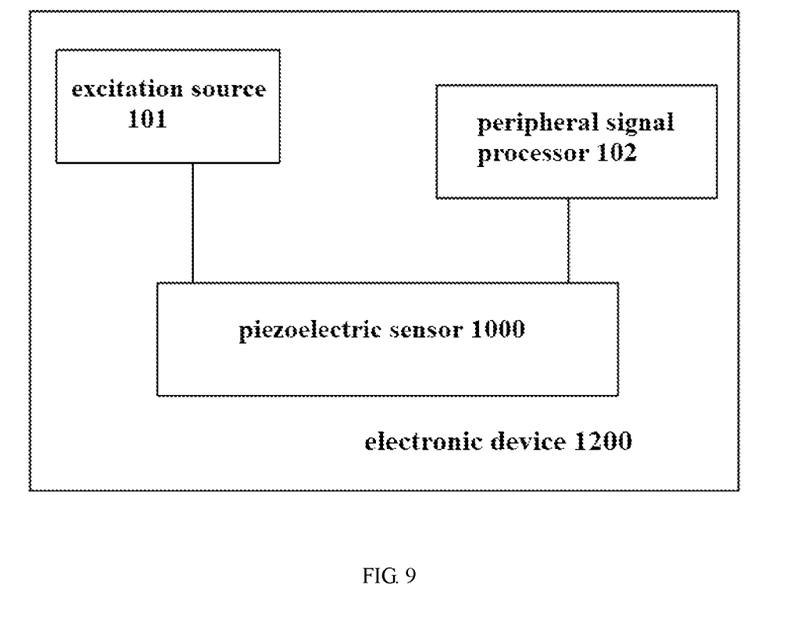
FIG. 9 is a schematic diagram of an electronic device provided by an embodiment of the present disclosure.

FIG. 9 is a schematic diagram of an electronic device according to an embodiment of the present disclosure. As illustrated in FIG. 9, the electronic device 1200 includes a piezoelectric sensor 1000, and an excitation source 101 and a peripheral signal processor 102 connected to the piezoelectric sensor 1000.

The peripheral signal processor in the embodiment of the present disclosure may also include one or more processors and one or more memories. The processor can process data signals, including various computing structures, such as a Complex Instruction Set Computer (CISC) structure, a Reduced Instruction Set Computer (RISC) structure or a structure that implements a plurality of instruction set combinations. The memory may store instructions and/or data executed by the processor. These instructions and/or data may include code for implementing some or all of the functions of one or more devices described in the embodiments of the present disclosure. For example, the memory includes a dynamic random access memory (DRAM), a static random access memory (SRAM), a flash memory, an optical memory, or other memories well known to those skilled in the art.

In some embodiments of this application, the peripheral signal processor includes codes and programs stored in a memory. The processor may execute the codes and programs to implement some or all functions of the foregoing peripheral signal processor.

In some embodiments of the present disclosure, the peripheral signal processor may be a special hardware device for realizing some or all functions of the foregoing peripheral signal processor. For example, the peripheral signal processor may be a circuit board or a combination of a plurality of circuit boards for implementing the foregoing functions. In the embodiment of the present disclosure, the circuit board or the combination of the plurality of circuit boards may include: (i) one or more processor; (ii) one or more non-transient computer-readable memory connected to the processor; and (iii) a processor executable firmware stored in the memory.

In the description of the specification, descriptions with reference to terms "one embodiment", "another embodiment" and the like mean that the specific features, structures, materials or characteristics described with reference to the embodiment are included in at least one embodiment of the present disclosure. In this specification, the schematic expression of the foregoing terms does not have to refer to the same embodiment or example. Moreover, the specific features, structures, materials or characteristics as described may be combined in a suitable manner in any one or more embodiments or examples. In addition, without contradiction, those skilled in the art may combine different embodiments or examples and features of different embodiments or examples described in this specification. In addition, it should be noted that in this specification, the terms "first" and "second" are only used for descriptive purposes, and cannot be understood as indicating or implying relative importance or implicitly indicating the number of technical features as indicated.

Although the present disclosure has been described in details with general description and specific embodiments, it is obvious to those skilled in the art that some modifications or improvements can be made based on the embodiments of the present disclosure. Therefore, these modifications or improvements made without departing from the spirit of the present disclosure belong to the scope of protection sought to be protected by the present disclosure.

What is claimed is:

1. A piezoelectric sensor, comprising:
 a substrate;
 an active layer, the active layer being disposed at a side of the substrate;
 a first electrode, the first electrode being disposed at a side of the active layer away from the substrate, and the first electrode comprising a plurality of sub-electrodes disposed at intervals;
 a piezoelectric layer, the piezoelectric layer being disposed at a side of the first electrode away from the active layer; and
 a second electrode, the second electrode being disposed at a side of the piezoelectric layer away from the first electrode, wherein
 the active layer is configured to be capable of switching between an insulating state and a conducting state, and in the conducting state, the active layer is capable of conducting the plurality of sub-electrodes.

2. The piezoelectric sensor according to claim 1, wherein a spacing region is provided between adjacent sub-electrodes in the plurality of sub-electrodes, and an orthographic projection of the active layer on the substrate at least covers an orthographic projection of the spacing region on the substrate.

3. The piezoelectric sensor according to claim 1, further comprising: a piezoelectric sensing circuit, wherein the piezoelectric sensing circuit comprises a plurality of thin film transistors, and the plurality of thin film transistors are connected to the plurality of sub-electrodes in one-to-one correspondence.

4. The piezoelectric sensor according to claim 3, wherein a material of the active layer comprises a semiconductor material.

5. The piezoelectric sensor according to claim 4, wherein a threshold voltage of the active layer is not less than a threshold voltage of each of the plurality of thin film transistors.

6. The piezoelectric sensor according to claim 1, wherein a material of the active layer comprises a semiconductor material having a P-channel characteristic or a semiconductor material having a N-channel characteristic.

7. The piezoelectric sensor according to claim 1, wherein the active layer is in contact with the plurality of sub-electrodes.

8. The piezoelectric sensor according to claim 3, further comprising:
 an insulating layer, wherein the insulating layer is disposed at a side of the active layer away from the first electrode, wherein
 the piezoelectric sensing circuit is disposed at a side of the insulating layer away from the active layer, and each of the plurality of thin film transistors is connected to one of the plurality of sub-electrodes through a via hole.

9. The piezoelectric sensor according to claim 8, further comprising a protecting layer, wherein the protecting layer is disposed at a side of the second electrode away from the piezoelectric layer.

10. An electronic device, comprising a fingerprint sensor, wherein the fingerprint sensor comprises the piezoelectric sensor according to claim 1.

11. The electronic device according to claim 10, further comprising an excitation source and a peripheral signal processor both connected to the piezoelectric sensor, wherein
the excitation source controls the piezoelectric sensor to generate an ultrasonic wave, the ultrasonic wave is transmitted by the piezoelectric sensor and acts on a finger, and
the piezoelectric sensor is configured to receive the ultrasonic wave reflected by the finger, convert the ultrasonic wave into a piezoelectric signal, and output the piezoelectric signal to the peripheral signal processor.

12. The electronic device according to claim 10, further comprising: a display screen, wherein the piezoelectric sensor is fixedly disposed at a side of the display screen facing away from a light-emitting side by using an optical bonding layer, and the substrate of the piezoelectric sensor is in contact with the optical bonding layer.

13. The electronic device according to claim 10, wherein a spacing region is provided between adjacent sub-electrodes in the plurality of sub-electrodes, and an orthographic projection of the active layer on the substrate at least covers an orthographic projection of the spacing region on the substrate.

14. A manufacturing method a piezoelectric sensor, comprising:
forming an active layer at a side of a substrate, the active layer being capable of switching between an insulating state and a conducting state;
forming a first electrode at a side of the active layer away from the substrate, the first electrode comprising a plurality of sub-electrodes disposed at intervals;
forming a piezoelectric layer at a side of the first electrode away from the substrate; and
forming a second electrode at a side of the piezoelectric layer away from the first electrode, wherein
in the conducting state, the active layer is capable of conducting the plurality of sub-electrodes.

15. The manufacturing method according to claim 14, further comprising: polarizing the piezoelectric layer to form the piezoelectric sensor, and
when the piezoelectric layer is polarized, the active layer is capable of switching from the insulating state to the conducting state so as to conduct the plurality of sub-electrodes.

16. The manufacturing method according to claim 14, wherein a spacing region is provided between adjacent sub-electrodes in the plurality of sub-electrodes, and an orthographic projection of the active layer on the substrate at least covers an orthographic projection of the spacing region on the substrate.

17. The manufacturing method according to claim 15, further comprising forming a piezoelectric sensing circuit, wherein the piezoelectric sensing circuit comprises a plurality of thin film transistors, and the plurality of thin film transistors are connected to the plurality of sub-electrodes in a one-to-one correspondence.

18. The manufacturing method according to claim 17, wherein polarizing the piezoelectric layer comprises:
conducting the plurality of thin film transistors, applying a fixed voltage to the plurality of sub-electrodes respectively, and electrically connecting the second electrode to a high-voltage power supply, so that the active layer is switched from the insulating state to the conducting state to conduct the plurality of sub-electrodes;
polarizing the piezoelectric layer by using a high-voltage electric field generated between the first electrode and the second electrode; and
disconnecting the second electrode from the high-voltage power supply upon the piezoelectric layer having been polarized, and switching the active layer from the conducting state to the insulating state to form the piezoelectric sensor.

19. The manufacturing method according to claim 14, further comprising:
forming a piezoelectric sensing circuit at a side of the substrate, the piezoelectric sensing circuit comprising a plurality of thin film transistors;
forming an insulating layer at a side of the piezoelectric sensing circuit away from the substrate, and forming a via hole in the insulating layer, to electrically connect the piezoelectric sensing circuit to the plurality of sub-electrodes;
forming the active layer at a side of the insulating layer away from the piezoelectric sensing circuit;
forming the first electrode at a side of the active layer away from the insulating layer;
forming the piezoelectric layer at a side of the first electrode away from the active layer; and
forming the second electrode at a side of the piezoelectric layer away from the first electrode, and forming a protecting layer at a side of the second electrode away from the piezoelectric layer.

20. The manufacturing method according to claim 19, wherein forming the piezoelectric layer comprises: spin-coating a thin film of polyvinylidene fluoride on the first electrode, and forming the piezoelectric layer by using the thin film of polyvinylidene fluoride.

* * * * *